March 12, 1968 L. PESSEL 3,373,061

CHALCOGENIDE THERMOELECTRIC DEVICE HAVING A BRAZE COMPRISING ANTIMONY COMPOUNDS AND METHOD OF FORMING SAID DEVICE

Filed July 19, 1962

INVENTOR.
LEOPOLD PESSEL
BY
W. S. Hill
AGENT 3,373,061
Patented Mar. 12, 1968

3,373,061

CHALCOGENIDE THERMOELECTRIC DEVICE HAVING A BRAZE COMPRISING ANTIMONY COMPOUNDS AND METHOD OF FORMING SAID DEVICE

Leopold Pessel, Wyndmoor, Pa., assignor to Radio Corporation of America, a corporation of Delaware Filed July 19, 1962, Ser. No. 210,889
5 Claims. (Cl. 136—237)

Figure 1:
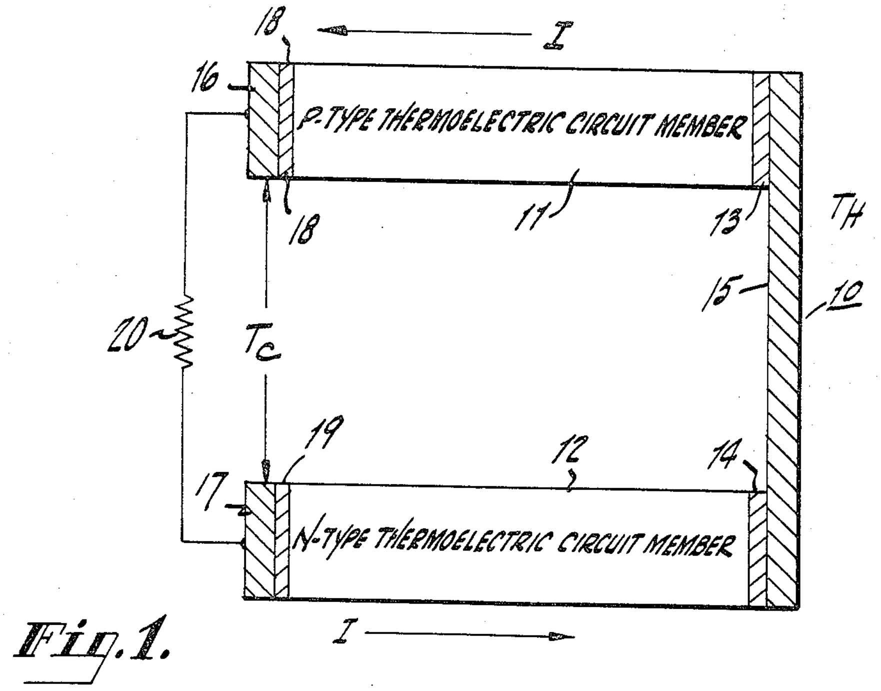

This invention relates to improved thermoelectric devices and to improved methods for fabricating such devices. More particularly, the invention relates to improved methods for obtaining low electrical resistance bonds to thermoelectric bodies selected from the group consisting of sulfides, selenides, and tellurides.

Thermoelectric components or circuit members are made of bodies of thermoelectric materials such as bismuth telluride, lead telluride, germanium telluride, silver indium telluride, silver gallium telluride, copper gallium telluride, and the like. Similar compounds of selenium, for example silver antimony selenide, and compounds of sulfur, for example the rare earth sulfides, are also useful in thermoelectric devices. Such compounds containing at least one member of the group consisting of sulfur, selenium and tellurium are generally known as chalcogenides. While the pure compounds may be utilized, thermoelectric compositions usually consist of alloys or solid solutions of more than one compound. Small amounts of various additives of doping agents may be incorporated in the thermoelectric composition to modify the conductivity type of the material.

Thermoelectric devices which convert heat energy directly into electrical energy by means of the Seebeck effect generally comprise two thermoelectric circuit members or components bonded to a block of metal, which may, for example, be copper, to form a thermoelectric junction. The two members are of thermoelectrically complementary types, that is, one member is made of P-type thermoelectric material and the other of N-type thermoelectric material. Whether a particular thermoelectric material is designated N-type or P-type depends on the direction of current flow across the cold junction of a thermocouple formed by the thermoelectric material in question and a metal such as copper or lead when the thermocouple is operating as a thermoelectric generator according to the Seebeck effect. If the current in the external circuit flows from the thermoelectric material, then the material is designated as "P-type"; if the current in the external circuit flows toward the thermoelectric material, then the material is designated as "N-type." The present invention relates to both P-type and N-type thermoelectric materials.

A good thermoelectric material should have a low electrical resistivity, since the Seebeck EMF generated in energy converters of this type is dependent upon the temperature difference between the hot and cool junctions. The generation of Joulean heat in the thermoelectric device due to the electrical resistance of either the thermoelectric members, or the auxiliary components, or the electrical contacts to the two members, will reduce the efficiency of the device.

The presence of high resistance contacts on the thermoelectric circuit members has been a serious problem in the fabrication of both Seebeck and Peltier thermoelectric devices. High resistance contacts have reduced the cooling produced by Peltier devices as much as 40 percent below the theoretical maximum value. For a discussion of the effect of contact resistance on the maximum cooling obtained in Peltier devices, see FIGURE 5 of chapter 8, "Evaluations and Properties of Materials for Thermoelectric Applications," by F. D. Rosi and E. G. Ramberg, in "Thermoelectricity," edited by P. H. Egli, John Wiley and Sons, Inc., New York, 1960.

It is therefore an object of the instant invention to provide methods and materials for making low resistance electrical contacts to thermoelectric circuit members.

Another object of the invention is to provide improved methods and materials for obtaining low resistance, mechanically strong, electrical connections to thermoelectric components.

A further object of the invention is to provide improved methods and materials for obtaining low resistance, mechanically strong, electrical bonds between a metal body and a thermoelectric circuit member.

Still another object of the invention is to provide improved thermoelectric devices.

These and other objects and advantages of the instant invention are accomplished by forming a low electrical resistance connection between a thermoelectric body composed of at least one compound selected from the class consisting of sulfides, selenides, and tellurides and another body by bonding said bodies with a braze selected from the group consisting if the intermetallic compounds of antimony. The compounds palladium antimonide, antimony telluride, indium antimonide, and silver antimony telluride have been found particularly advantageous. According to one embodiment of the invention, the braze may include a small amount of a material which is a doping agent in the thermoelectric body.

Figure 2:
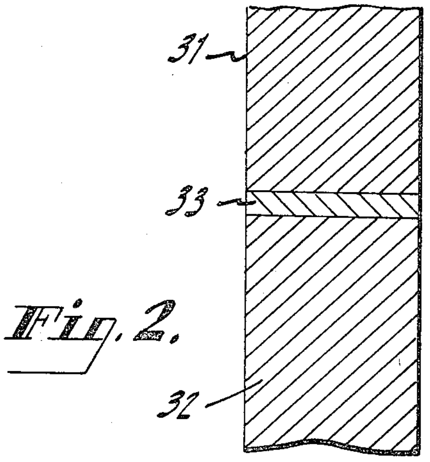

The invention will be described in greater detail by the following examples, in conjunction with the accompanying drawing, in which:

FIGURE 1 is a cross-sectional view of a thermoelectric device intended to be operated as a Seebeck effect current generator or thermocouple comprising two thermoelectrically complementary circuit members bonded to a metal block in accordance with a first embodiment of the invention; and, FIGURE 2 is a cross-sectional view of a thermoelectric body bonded to another body in accordance with a second embodiment of the invention.

Referring now to FIGURE 1, the thermoelectric device 10 comprises a thermoelectric component 11, which may, as illustrated, be P-type, and a complementary type thermoelectric circuit member 12, which in this example is N-type, as illustrated in the drawing. Each circuit member is composed of at least one compound selected from the group consisting of sulfides, selenides and tellurides. It will be understood that the conductivity types of circuit members 11 and 12 may be reversed. One end of component or circuit member 11 is bonded to an electrical contact 16, and one end of circuit member 12 is similarly bonded to an electrical contact 17. Advantageously, contacts 16 and 17 are blocks of metal such as copper or the like. The bonds between thermoelectric circuit members 11 and 12 and their respective contacts 16 and 17 consist of solder layers 18 and 19, respectively. The other ends are bonded to an intermediate member 15, in the form of a buss bar or plate. Member 15 is made of a material which is thermally and electrically conductive, and has a negligible thermoelectric power. Bodies of metal or metallic alloys are suitable for this purpose. In this example, intermediate member 15 consists of a copper plate. The bond between thermoelectric circuit members 11 and 12 and the metal plate 15 consists of solder layers 13 and 14 respectively. The low electrical resistance solder layers 13, 14, 18, and 19 consist of an intermetallic compound of antimony selected from the group consisting of palladium antimonide, indium antimonide, silver antimony telluride and antimony telluride.

In the operation of the thermoelectric device 10 as a current generator, the metal plate 15 (and its junctions to thermoelectric members 11 and 12) is heated to a temperature $T_H$ and becomes the hot junction of the device. The metal contacts 16 and 17 on thermoelements 11 and 12, respectively, are maintained at a temperature $T_C$, which is lower than the temperature ($T_H$) of the hot junction of the device. The lower or cold junction temperature ($T_C$) may, for example, be room temperature. A temperature gradient is thus established in each circuit member 11 and 12, from a high temperature adjacent plate 15 to a low temperature adjacent contacts 16 and 17, respectively. The electromotive force developed under these conditions produces in the external circuit a flow of conventional current (I) in the direction shown by arrows in FIGURE 1; that is, the current flows in the external circuit from the P-type thermoelement 11 toward the N-type thermoelement 12. The device is utilized by connecting a load, shown as a resistance 20 in the drawing, between the contacts 16 and 17 of the thermoelements 11 and 12, respectively.

*Example I*

Palladium antimonide was comminuted by grinding it in an agate mortar to a fine powder, and the powdered material was mixed with about 1 percent of its weight of an organic lubricating compound such as powdered stearyl alcohol. Small batches of this mixture (weighing about 0.1 gram each) were placed in a ¼ inch diameter mold and a pressure of about 60 tons per square inch was applied to the mix. The thin disk-shaped perform thus fabricated tends to break when handled. In order to increase the mechanical strength of the preform, it is sintered in a non-oxidizing ambient at a temperature a little below its melting point. In this example, the "green" preforms were heated to about 590° C. for about one hour in an ambient consisting of 93 percent nitrogen and 7 percent hydrogen by volume. The resulting sintered preforms are discs about ¼ inch in diameter and .02 inch thick, and have sufficient mechanical strength to be stored and handled without breaking.

The P-type thermoelectric circuit member 11 and the N-type thermoelectric circuit member 12 may consist of any of the thermoelectric materials previously mentioned. Preferably each thermoelectric material utilized should have a melting point higher than that of the intermetallic antimony compound utilized as the braze. In this example, thermoelectric circuit member 11 consists of P-type lead telluride, and thermoelectric circuit member 12 consists of N-type lead telluride. The members 11 and 12 are in the form of cylinders about ¼ inch in diameter and ¼ inch in length.

A mechanically strong low electrical resistance bond between the P-type circuit member 11 and the metal contact block 16 is attained as follows. The surfaces to be joined are mechanically cleaned by rubbing them with emery paper. If desired, the surfaces may be fluxed with a solution of a metal halide such as a fluoride salt, or other fluxes known to the art. A palladium antimonide preform 18 prepared by grinding, pressing and sintering as described above is positioned between the surfaces of P-type member 11 and metal contact block 16 to be joined. The metal contact block 16 may consist of silver, copper, nickel, iron, ferrous alloys such as steel, or other metallic alloys. In this example, the contact block 16 consists of nickel-plated copper, and is in the form of a disc about ¼ inch in diameter and ¹⁄₁₆ inch thick. The circuit member 11 and the contact block 16 are pressed together against opposite faces of the brazing preform 18 while heating the assemblage in a non-oxidizing ambient to a temperature above the melting point of the palladium antimonide preform (600° C.) but below the melting point of the thermoelectric circuit member. In this example, the non-oxidizing ambient consists of 93 percent nitrogen—7 percent hydrogen by volume, and heating is performed in an electric resistance furnace for about 10 minutes at about 700° C. The actual heating time utilized depends on the work load, the furnace characteristics, and the type of jigs used. The assemblage is maintained under sufficient pressure to maintain intimate contact of the mating surfaces by means of a spring-loaded metal jig (not shown). Such jigs may be made in many different forms by those skilled in the art. The exact pressure utilized is not critical in the practice of the invention. If desired, thin mica sheets or equivalent nonmetallic sheets (not shown) may be inserted between the assemblage and the jig to prevent any accidental joining by excess flow of the brazing material.

It will be understood that in practice both ends of the thermoelectric element 11 may be simultaneously fluxed, then bonded to metal contact block 16 and metal plate 15 by means of palladium antimonide brazing preforms 18 and 13, respectively. The N-type thermoelectric circuit member 12 may be similarly bonded to metal contact block 17 and metal plate 15 by means of palladium antimonide braze preforms 19 and 14, respectively. Alternatively, both thermoelectric components or thermoelements 11 and 12 may be simultaneously bonded between metal plate 12 and metal contacts 16 and 17 respectively in a single heating step.

The average shear strength of 25 thermocouples bonded by intermetallic antimony compounds according to the invention correspond to about 120 pounds per square inch. In almost all cases, the thermoelectric circuit elements 11 and 12 failed before the bond between the circuit element and the metal plate 15, indicating that the true average strength of the bond was probably greater than 120 pounds per square inch.

The stability at elevated temperatures of the bonds fabricated by a palladium antimonide braze to this example was tested by maintaining a thermoelectric couple thus formed between a heat source and a water-cooled heat sink for continuous periods up to about 100 hours, and measuring the Seebeck voltage developed by the P-type circuit member and the N-type circuit member. For a thermoelectric couple consisting of a P-type lead telluride thermoelement and an N-type lead telluride thermoelement bonded by means of palladium antimonide performs, as described above, to a cold rolled steel plate and cold rolled steel contact blocks, the following results of a test were obtained.

TABLE I.—PALLADIUM ANTIMONIDE BRAZE

| Duration of Test, Hrs. | Seebeck Voltage, μv./° C. | | Hot Junction, ° C. |
|---|---|---|---|
| | N | P | |
| 0 | 290 | 241 | 485 |
| 8 | 298 | 237 | 480 |
| 15 | 299 | 233 | 479 |
| 31 | 304 | 222 | 470 |
| 39 | 305 | 217 | 466 |
| 47 | 307 | 214 | 466 |
| 71 | 301 | 218 | 483 |
| 95 | 299 | 208 | 487 |
| 102 | 304 | 195 | 474 |

It will be noted that for the P-type thermoelement there was a small decline in the Seebeck voltage with time of exposure to heat, while for the N-type thermoelement there was no decline at all, as the Seebeck voltage actually increased in value after prolonged heating.

*Example II*

According to another embodiment of the invention, a mechanically strong, low electrical resistance bond between a metal block and a thermoelectric circuit member composed of at least one member of the group consisting of sulfides, selenides, and tellurides is obtained in a manner similar to that described above in Example I, but utilizing a braze consisting of antimony telluride. The antimony telluride is comminuted by grinding, mixed with about 1 percent of its weight of stearyl alcohol, pressed into a preform at a pressure of about 60 tons per square inch, and the preform is sintered in forming gas at about 510° C. for about one hour. The antimony telluride preform of the same shape and size as in Example I is utilized as described above to braze a metallic body to a thermoelectric circuit member. The parts are cleaned and prepared as in Example I. The assemblage consisting of a metal contact block, a sintered antimony telluride brazing preform, and a thermoelectric body is heated in a spring-loaded jig to press the parts together to a temperature above the melting point of antimony telluride (620° C.) but below the melting point of the thermoelectric body.

The stability at elevated temperatures of the bonds fabricated with an antimony telluride brazing preform according to this example was tested by maintaining a thermoelectric couple thus formed between a heat source and a water-cooled heat sink for a continuous period up to about 100 hours, and measuring the Seebeck voltage developed by the P-type circuit member and the N-type circuit member. For a thermoelectric couple of the same thermoelectric materials, metals and dimensions as Example I, but utilizing antimony telluride brazing preforms instead of palladium antimonide, the following results were obtained.

TABLE II.—ANTIMONY TELLURIDE BRAZE

| Duration of Test, Hrs. | Seebeck Voltage, µv./° C. | | Hot Junction, ° C. |
|---|---|---|---|
| | N | P | |
| 0 | 202 | 114 | 365 |
| 10 | 205 | 115 | 358 |
| 20 | 191 | 137 | 369 |
| 30 | 193 | 146 | 361 |
| 40 | 189 | 139 | 354 |
| 50 | 193 | 138 | 350 |
| 60 | 224 | 187 | 507 |
| 70 | 229 | 194 | 501 |
| 80 | 231 | 193 | 493 |
| 90 | 232 | 196 | 491 |
| 100 | 227 | 193 | 499 |
| 108 | 229 | 198 | 501 |

It will be noted that the Seebeck voltage of both the N-type and P-type thermoelement increased in value after prolonged heating at elevated temperatures.

*Example III*

According to another embodiment of the invention, a mechanically strong low electrical resistance bond between a metal block and a thermoelectric circuit member composed of at least one member of the group consisting of sulfides, selenides, and tellurides is obtained in a manner similar to that described in Example I, but utilizing a braze consisting of indium antimonide instead of the brazes in the prior examples. The indium antimonide is comminuted by grinding, mixed with 1 percent of its weight of a lubricant such as stearyl alcohol, pressed into a preform at a pressure of about 60 tons per square inch, and the preform is sintered in forming gas at about 455° C. for about one hour. The indium antimonide preform is utilized instead of the other preforms in Example I or Example II to braze a metallic body to a thermoelectric circuit member. An assemblage prepared in the manner of the previous examples, consisting of a metal contact block, a sintered indium antimonide brazing preform (in lieu of the preform of a prior example), and a thermoelectric body is heated in a spring-loaded jig to a temperature above the melting point of indium antimonide (535° C.) but below the melting point of the thermoelectric body.

The stability at elevated temperatures of the bonds fabricated with such an indium antimonide brazing preform was tested by maintaining a thermoelectric couple thus formed between a heat source and a water-cooled heat sink for a continuous period up to about 55 hours and measuring the Seebeck voltage developed by the P-type circuit member and the N-type circuit member. For a thermoelectric couple of similar thermoelectric materials, metals and dimensions as Example I but utilizing indium antimonide brazing preforms instead of palladium antimonide, the following results were obtained.

TABLE III.—INDIUM ANTIMONIDE BRAZE

| Duration of Test, Hrs. | Seebeck Voltage, µv./° C. | | Hot Junction, ° C. |
|---|---|---|---|
| | N | P | |
| 0 | 222 | 149 | 433 |
| 8 | 223 | 153 | 426 |
| 31 | 201 | 188 | 440 |
| 55 | 181 | 230 | 481 |

*Example IV*

According to another embodiment of the invention, a mechanically strong low electrical resistance bond between a metal block and a thermoelectric circuit member is obtained in a manner similar to that described in Example I but utilizing a braze consisting of silver antimony telluride. The silver antimony telluride is comminuted by grinding in a mortar, mixed with about 1 percent of its weight of stearyl alcohol, pressed into a preform at a pressure of about 60 tons per square inch, and the preform is sintered in forming gas at about 480° C. for about one hour. The silver antimony telluride preform is utilized as described above to braze a metallic body to a thermoelectric circuit member consisting of at least one member of the group consisting of sulfides, selenides, and tellurides. The assemblage consisting of a metal contact block, a sintered silver antimony telluride brazing preform, and the thermoelectric body is heated in a spring-loaded jig to a temperature above the melting point above the silver antimony telluride preform (570° C.) but below the melting point of the thermoelectric body.

The stability at elevated temperatures of the bonds fabricated with a silver antimony telluride brazing preform according to this embodiment of the invention was tested by maintaining a thermoelectric couple thus formed between a heat source and a water-cooled heat sink for a continuous period up to about 53 hours, and measuring the Seebeck voltage developed by the P-type circuit member and the N-type circuit member. For a thermoelectric couple of similar thermoelectric materials, metals and dimensions as Example I but utilizing silver antimony telluride brazing preforms instead of palladium antimonide, the following results were obtained.

TABLE IV.—SILVER ANTIMONY TELLURIDE BRAZE

| Duration of Test, Hrs. | Seebeck Voltage, µv./° C. | | Hot Junction, ° C. |
|---|---|---|---|
| | N | P | |
| 0 | 193 | 198 | 467 |
| 22 | 232 | 217 | 507 |
| 29 | 247 | 218 | 477 |
| 30 | 239 | 201 | 462 |
| 53 | 242 | 168 | 503 |

*Example V*

The method of the invention may also be utilized as follows to form a mechanically strong low electrical resistance bond between two thermoelectric bodies, each of which includes at least one member of the group consisting of sulfides, selenides, and tellurides.

Referring now to FIGURE 2, the two thermoelectric bodies 31 and 32 may consist of any of the P-type or N-type thermoelectric compositions mentioned above. In this example, thermoelectric body 31 consists of lead telluride, which melts at about 900° C. and thermoelectric body 32 consists of germanium telluride, which melts at about 720° C.

Advantageously, the second thermoelectric body 32 is of the same conductivity type as the first thermoelectric body 31. It has been found that when a composite thermoelement of given conductivity type is fabricated with one portion consisting of a first thermoelectric material having a first energy gap bonded to a second portion consisting of a second thermoelectric material having a second energy gap, increased efficiency in the conversion from heat to electrical power is obtained providing the composite thermoelement is utilized with the portion of higher energy gap adjacent the hot junction of the thermocouple and the portion of lower energy gap adjacent the cold junction of the device. In such an arrangement, each thermoelectric material is being utilized in the temperature range in which it is most efficient. See Figure 3 of Rosi Dismukes and Hockings, "Semiconductor Materials for Thermoelectric Power Generation Up to 700° C.," Electrical Engineering, June 1960.

In this example, a palladium antimonide brazing preform is prepared as described above. The surface portions of thermoelectric bodies 31 and 32 to be bonded are mechanically cleaned as described above in Example I. The palladium antimonide brazing preform 33 is positioned between the two cleaned surfaces of thermoelectric bodies 31 and 32. The two bodies are then pressed together in a spring-loaded jig and heated at about 650° C. for about 20 minutes in a hydrogen ambient while maintaining the pressure between them. When the assemblage is cooled, a mechanically strong, low electrical resistance bond is formed between thermoelectric bodies 31 and 32 by the layer 33 of palladium antimonide between them. The bond thus formed is stable when cycled to temperatures as high as 550° C., since the melting point of palladium antimonide is about 600° C.

According to another embodiment of the invention, there may be incorporated in the braze significant amounts, from about 0.1 up to about 2.0 weight percent, of the substance utilized as the doping agent in the particular thermoelectric body being joined. For example, sulfides and selenides of copper or silver are donors in bismuth telluride as described in U.S. Patent 2,902,592, issued to C. J. Busanovich on Sept. 1, 1959, and assigned to the assignee of the instant application. The halides of bismuth or antimony are donors in bismuth telluride-antimony telluride alloys, as described in U.S. Patent 2,957,937, issued to R. V. Jensen and F. D. Rosi on Oct. 25, 1960, and assigned to the assignee of the instant application. The oxides of copper, silver, gold and mercury are acceptors in bismuth telluride, in bismuth telluride-antimony telluride alloys, and in bismuth telluride-antimony telluride-antimony selenide alloys, as described in U.S. Patent 2,953,616, issued to L. Pessel and T. Q. Dzieminanowicz on Sept. 20, 1960, and assigned to the assignee of the instant application. A small amount of excess lead acts as a donor in lead telluride, and a small amount of excess tellurium acts as an acceptor in lead telluride. Amounts of the order of 0.1 to 2.0 weight percent are considered significant for doping thermoelectric materials. The addition of significant amounts of the appropriate acceptor or donor material in the brazing preform helps to prevent outdiffusion of the doping agent from the thermoelectric body into the braze, and thus helps prevent deterioration of the resistivity and other parameters of the thermoelectric body.

It will be understood that the embodiments described above are by way of example only, and not limitation. Various modifications may be made without departing from the spirit and scope of the instant invention. For example, the plate 15 and contact blocks 16 and 17 may consist of pure metals such as molybdenum, or of clad metals, or may be formed of alloys instead of pure metals. The stearyl alcohol mentioned above is utilized solely as a lubricant to aid compressing the powdered brazing material. It may be replaced by any of a large class of similar compounds, such as cetyl alcohol, oleyl alcohol, linoleyl alcohol myristyl alcohol, lauryl alcohol, and the like. Moreover, it is not necessary that the brazing preform be fabricated by compressing the powdered material. A large slab of the intermetallic antimony compound brazing material may be formed by any convenient method, and then cut into portions of suitable size.

What is claimed is:

1. The method of forming a low electrical resistance connection between a thermoelectric body composed of at least one member selected from the group consisting of sulfides, selenides, and tellurides, and another body, comprising the step of bonding said bodies with a braze selected from the group of intermetallic compounds consisting of palladium antimonide, antimony telluride, indium antimonide, and silver antimony telluride, said thermoelectric body being composed of a different compound from said braze compounds.

2. The method of forming a low electrical resistance connection between a doped thermoelectric body composed of at least one member of the group consisting of sulfides, selenides, and tellurides, and another body, comprising bonding said bodies with a braze selected from the group consisting of palladium antimonide, antimony telluride, indium antimonide, and silver antimony telluride, said braze including from about 0.1 to 2.0 weight percent of the substance used as a doping agent in said thermoelectric body, said thermoelectric body being composed of a different compound from said braze compounds.

3. The method of forming a low electrical resistance connection between a thermoelectric body composed of at least one member of the group consisting of sulfides, selenides, and tellurides, and another body, comprising the steps of comminuting a compound selected from the group consisting of palladium antimonide, antimony telluride, indium antimonide, and silver antimony telluride; pressing said comminuted compound into a preform; positioning said preform between the surfaces of said bodies to be joined; pressing said bodies together; and heating said bodies in a non-oxidizing ambient to a temperature above the melting point of said compound but below the melting point of said thermoelectric body while maintaining said pressure.

4. A thermoelectric device including a body of thermoelectric material comprising at least one member of the group consisting of sulfides, selenides, and tellurides, and having another body bonded thereto, the bond between said bodies comprising a layer of a braze selected from the group consisting of palladium antimonide, antimony telluride, indium antimonide, and silver antimony telluride, said thermoelectric material being comprised of a different compound from said braze compounds.

5. A thermoelectric device including a doped body of thermoelectric material comprising at least one member of the group consisting of sulfides, selenides, and tellurides, and having another body bonded thereto, the bond between said bodies comprising a layer of a braze selected from the group consisting of palladium antimonide, antimony telluride, indium antimonide, and silver antimony telluride, said layer of braze including from about 0.1 to 2.0 weight percent of the substance used as a doping agent in said thermoelectric body, said thermoelectric material being comprised of a different compound from said braze compounds.

References Cited

UNITED STATES PATENTS

| | | | |
|---|---|---|---|
| 2,712,563 | 7/1955 | Faus et al. | 136—237 X |
| 2,798,989 | 7/1957 | Welker | 136—236 X |
| 2,882,467 | 4/1959 | Wernick | 252—62.3 X |
| 2,882,468 | 4/1959 | Wernick | 252—62.3 X |
| 3,050,574 | 8/1962 | Rosi | 136—236 X |
| 3,051,767 | 8/1962 | Fredrick et al. | 136—236 X |
| 2,464,821 | 3/1949 | Ludwick | 29—502 |
| 3,037,064 | 5/1962 | Rosi et al. | 136—5 |

FOREIGN PATENTS

| | | |
|---|---|---|
| 24,178 | 9/1905 | Great Britain. |
| 211,206 | 11/1957 | Australia. |

ALLEN B. CURTIS, *Primary Examiner.*

JOHN H. MACK, *Examiner.*

A. M. BEKELMAN, *Assistant Examiner.*